US010366993B2

(12) United States Patent
Chang et al.

(10) Patent No.: US 10,366,993 B2
(45) Date of Patent: Jul. 30, 2019

(54) SEMICONDUCTOR STRUCTURE HAVING AIR GAP BETWEEN GATE ELECTRODE AND DISTAL END PORTION OF ACTIVE AREA

(71) Applicants: UNITED MICROELECTRONICS CORP., Hsin-Chu (TW); Fujian Jinhua Integrated Circuit Co., Ltd., Quanzhou, Fujian province (CN)

(72) Inventors: Feng-Yi Chang, Tainan (TW); Fu-Che Lee, Taichung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 1 day.

(21) Appl. No.: 15/655,909

(22) Filed: Jul. 21, 2017

(65) Prior Publication Data

US 2019/0006368 A1 Jan. 3, 2019

(30) Foreign Application Priority Data

Jun. 30, 2017 (CN) .......................... 2017 1 0521095

(51) Int. Cl.
*H01L 27/108* (2006.01)
*H01L 29/06* (2006.01)
*H01L 29/49* (2006.01)

(52) U.S. Cl.
CPC .. *H01L 27/10823* (2013.01); *H01L 27/10876* (2013.01); *H01L 29/0649* (2013.01); *H01L 29/4991* (2013.01)

(58) Field of Classification Search
CPC ............... H01L 21/764; H01L 29/0649; H01L 21/76224; H01L 29/4236; H01L 27/10823; H01L 27/10876; H01L 29/4991; H01L 2221/1042; H01L 2221/1047
See application file for complete search history.

(56) References Cited

U.S. PATENT DOCUMENTS

| 7,525,133 | B2* | 4/2009 | Ohta ................... H01L 29/0649 257/213 |
| 8,153,489 | B2* | 4/2012 | Song ................ H01L 29/66621 257/E21.655 |
| 9,224,619 | B2* | 12/2015 | Yi ....................... H01L 29/4236 |
| 9,608,065 | B1* | 3/2017 | Bergendahl ......... H01L 27/0886 |
| 9,716,158 | B1* | 7/2017 | Cheng ................. H01L 29/4991 |
| 9,768,118 | B1* | 9/2017 | Li ....................... H01L 23/5283 |
| 9,853,031 | B1* | 12/2017 | Cho ................... H01L 27/10823 |
| 2010/0230741 | A1* | 9/2010 | Choi ................ H01L 21/76229 257/324 |
| 2011/0001186 | A1* | 1/2011 | Seo .................... H01L 21/82343 257/330 |
| 2011/0003459 | A1* | 1/2011 | Shin ..................... H01L 27/105 438/430 |
| 2013/0093019 | A1* | 4/2013 | Ando .................... H01L 29/785 257/347 |

(Continued)

*Primary Examiner* — Khiem D Nguyen
(74) *Attorney, Agent, or Firm* — Winston Hsu (57) ABSTRACT

A semiconductor structure includes a semiconductor substrate having a trench isolation region formed therein. A conductive gate electrode is buried in the trench isolation region. An air gap is disposed between the conductive gate electrode and the semiconductor substrate.

9 Claims, 11 Drawing Sheets (56) References Cited

U.S. PATENT DOCUMENTS

| | | | |
|---|---|---|---|
| 2013/0119462 A1* | 5/2013 | Kye | ................. H01L 27/10823 257/331 |
| 2014/0030884 A1* | 1/2014 | Rouh | ................... H01L 21/283 438/592 |
| 2014/0291755 A1* | 10/2014 | Baek | ................. H01L 29/4236 257/330 |
| 2014/0367775 A1* | 12/2014 | Min | ................. H01L 21/76224 257/334 |
| 2015/0333069 A1* | 11/2015 | Kim | ................. H01L 27/10814 257/334 |

* cited by examiner

SEMICONDUCTOR STRUCTURE HAVING AIR GAP BETWEEN GATE ELECTRODE AND DISTAL END PORTION OF ACTIVE AREA

CROSS REFERENCE TO RELATED APPLICATION

This application claims the priority from CN application No. 201710521095.5, filed Jun. 30, 2017, which is included in its entirety herein by reference.

BACKGROUND OF THE INVENTION

1. Field of the Invention

The present invention relates to the field of semiconductor technology, and in particular to a semiconductor structure, which can improve the row hammer phenomenon.

2. Description of the Prior Art

When the target row of the dynamic random access memory (DRAM) is activated too many times over a period of time, the data stored on adjacent rows adjacent to the target row is likely to be lost or interfered. More specifically, crosstalk resulted from the frequent activation of the target row may corrupt the data stored in the adjacent rows, which is also referred to as "row hammer" phenomenon.

With the increase of DRAM design density, the row hammer phenomenon will become more and more serious, which has become a technical problem to be solved in the industry.

SUMMARY OF THE INVENTION

It is one object of the present invention to provide a semiconductor structure which can improve the deficiencies and disadvantages of the prior art.

According to one aspect of the invention, a semiconductor structure includes a semiconductor substrate having a major surface, a trench isolation region in the semiconductor substrate, an active area surrounded by the trench isolation region in the semiconductor substrate, a first gate electrode buried in the active area and adjacent to a distal end portion of the active area, a second gate electrode buried in the trench isolation region and adjacent to the distal end portion of the active area, and an air gap between the second gate electrode and the distal end portion of the active area. The active area has a longitudinal axis extending along a first direction.

According to another aspect of the invention, the semiconductor structure comprises a semiconductor substrate having a trench isolation region therein. A conductive gate electrode is buried in the trench isolation region. The main technical feature of the present invention resides in an air gap interposed between the conductive gate electrode and the semiconductor substrate. A dielectric cap layer is provided on the conductive gate electrode and seals the air gap.

According to still another aspect of the invention, a method for fabricating a semiconductor structure is disclosed. A semiconductor substrate having a major surface is provided. A trench isolation region and an active area surrounded by the trench isolation region are formed in the semiconductor substrate. The active area has a longitudinal axis extending along a first direction. A first gate trench is formed in the active area and a second gate trench is formed in the trench isolation region. A sacrificial spacer is formed in the second gate trench. A first gate electrode and a second gate electrode are formed in the first gate trench and the second gate trench, respectively. The sacrificial spacer is removed from the second gate trench, thereby forming an air gap between the second gate electrode and the semiconductor substrate in the second gate trench. A cap dielectric layer is deposited on the second gate electrode. The cap dielectric layer seals the air gap.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1A to 11A are schematic, partial top views of a semiconductor structure in different manufacturing stages according to one embodiment of the present invention.

FIGS. 1B to 11B are schematic diagrams taken along sectional line I-I' in FIGS. 1A to 11A, respectively.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present disclosure.

The following detailed description is, therefore, not to be taken in a limiting sense, and the scope of the present invention is defined only by the appended claims, along with the full scope of equivalents to which such claims are entitled. One or more implementations of the present invention will now be described with reference to the attached drawings, wherein like reference numerals are used to refer to like elements throughout, and wherein the illustrated structures are not necessarily drawn to scale.

The present invention pertains to a semiconductor integrated circuit structure, for example, a dynamic random access memory (DRAM) structure having a localized air gap, which can improve the disadvantages of the prior art, for example, the row hammer phenomenon.

Please refer to FIGS. 1A to 11A and FIGS. 1B to 11B. FIGS. 1A to 11A are schematic, partial top views of a semiconductor structure in different manufacturing stages according to one embodiment of the present invention. FIGS. 1B to 11B are schematic diagrams taken along sectional line I-I' in FIGS. 1A to 11A, respectively.

For the sake of simplicity, only a portion of the circuit device area, for example, a portion of the memory array region is shown.

Figure 1A:
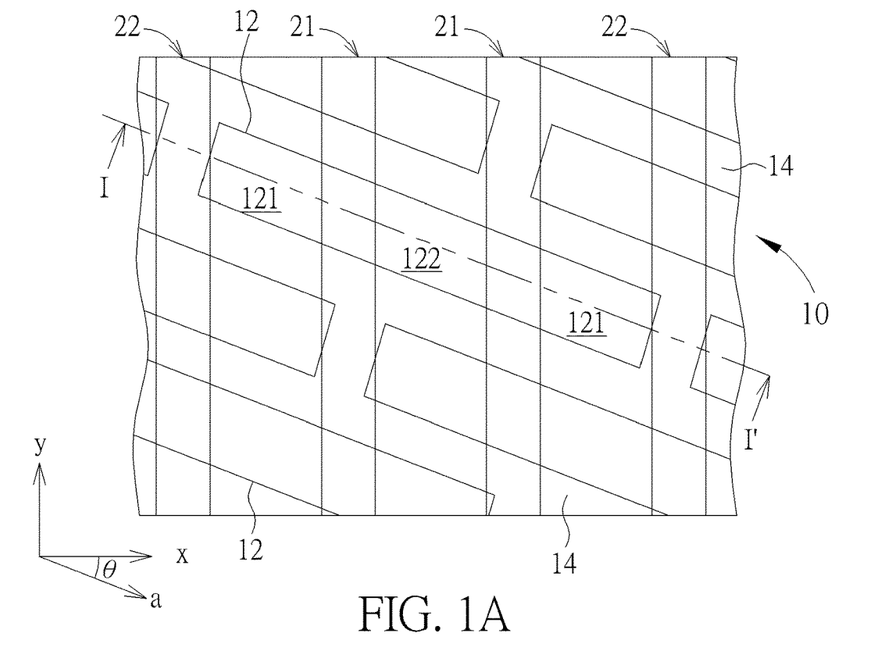
Figure 1B:
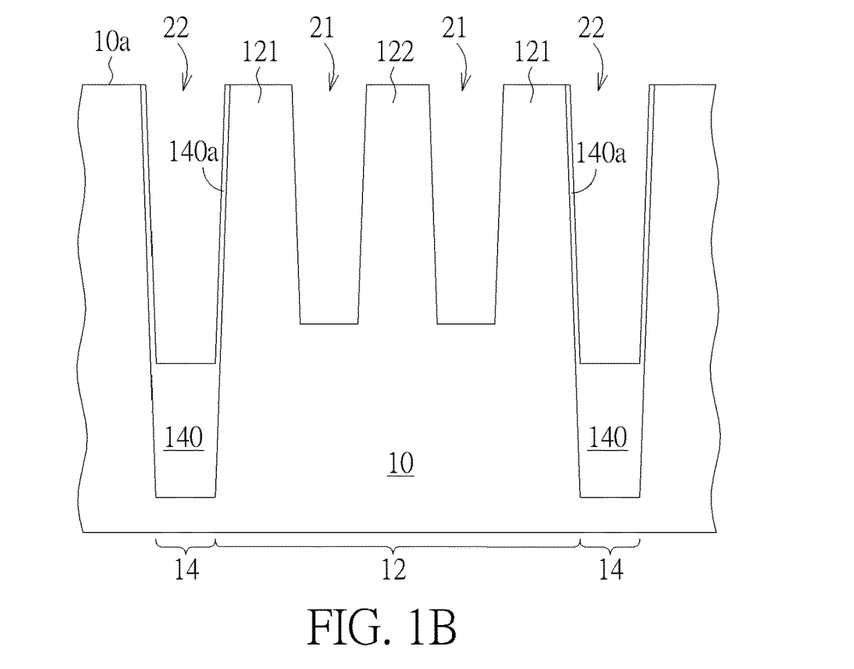

As shown in FIGS. 1A and 1B, first, a semiconductor substrate 10 having a major surface 10a is provided. A trench isolation region 14 and a plurality of elongated active areas 12 have been formed in the semiconductor substrate 10. The trench isolation region 14 comprises an insulating layer 140. The active areas 12 are surrounded by the trench isolation region 14 so that the active areas 12 are electrically isolated from one another.

According to one embodiment of the present invention, the insulating layer 140 may include a silicon oxide layer, a silicon nitride layer, or a combination thereof, but is not limited thereto.

According to one embodiment of the present invention, each active area 12 has a longer axis or longitudinal axis that extends in a first direction, for example, the reference a-axis direction in FIG. 1A, wherein the reference a-axis is the extending direction of the longer axis extension of each active area, and the angle between the reference a-axis and the reference x-axis is an acute angle θ.

Next, first gate trenches 21 and second gate trenches 22 are formed in the active area 12 and in the trench isolation region 14, respectively. As shown in FIG. 1B, it can be seen that the first gate trenches 21 pass through the active area 12 and the second gate trenches 22 pass through the trench isolation region 14.

According to one embodiment of the present invention, as shown in FIG. 1A, the first gate trenches 21 and the second gate trenches 22 are straight-line shaped trenches extending in a second direction, such as the reference y-axis direction. The second direction is not perpendicular to the first direction.

According to one embodiment of the present invention, each of the active areas 12 is divided into two distal end portions 121 and an intermediate portion 122 by two adjacent first gate trenches 21. The intermediate portion 122 may serve as digit line or a bit line contact area, and the two distal end portions 121 may serve as storage node contact areas.

As can be seen from FIG. 1B, there may be an insulating layer 140a on the sidewalls in the second gate trenches 22, for example, a silicon oxide layer, which remains on the sidewall surface of the distal end portion 121. However, the present invention is not limited thereto. In other embodiments, the insulating layer 140a may not be left on the sidewall of the distal end portions 121 so that part of the silicon surfaces of the sidewall of the distal end portions 121 may be exposed at this point.

Figure 2A:
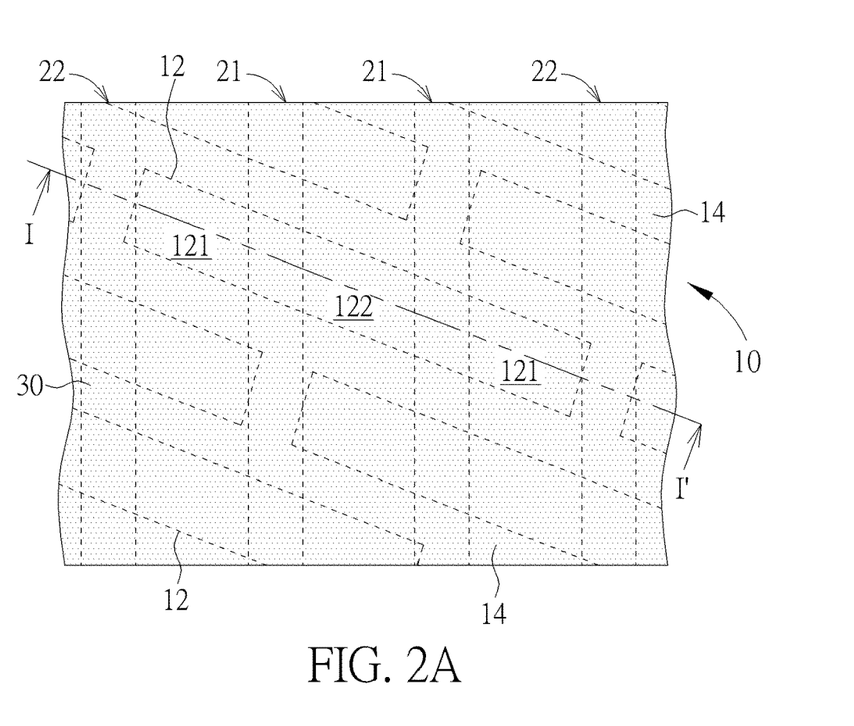
Figure 2B:
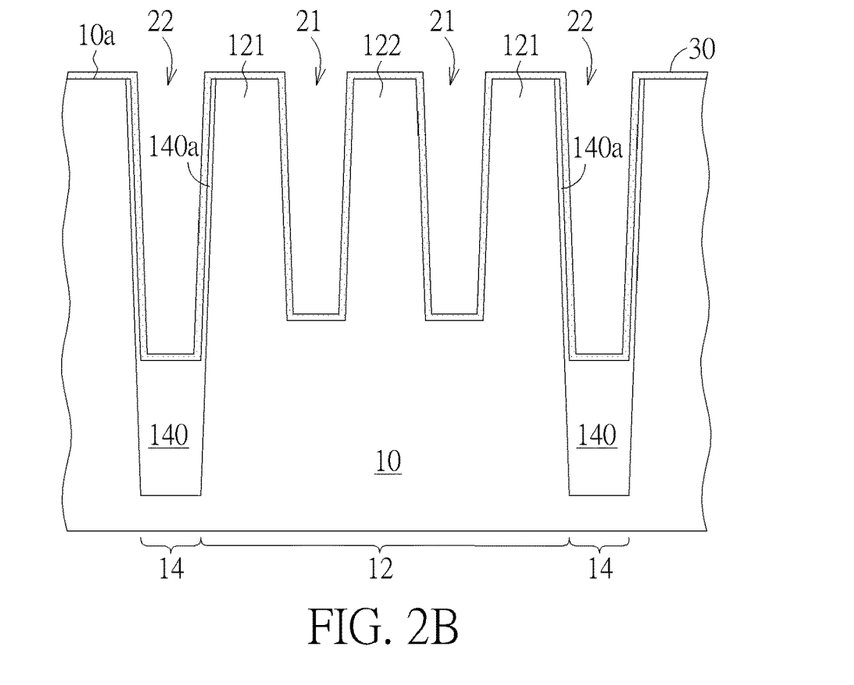

As shown in FIGS. 2A and 2B, a spacer material layer 30 is conformally deposited, in a blanket manner, on the semiconductor substrate 10, and in the first gate trenches 21 and the second gate trenches 22.

According to one embodiment of the present invention, the spacer material layer 30 may comprise a dielectric material having significant etching selectivity with respect to silicon oxide and silicon. For example, the spacer material layer 30 may comprise silicon nitride. According to one embodiment of the present invention, the spacer material layer 30 may be formed by atomic layer deposition (ALD) method, and may have a thickness ranging, for example, between 2 and 5 nanometers.

Figure 3A:
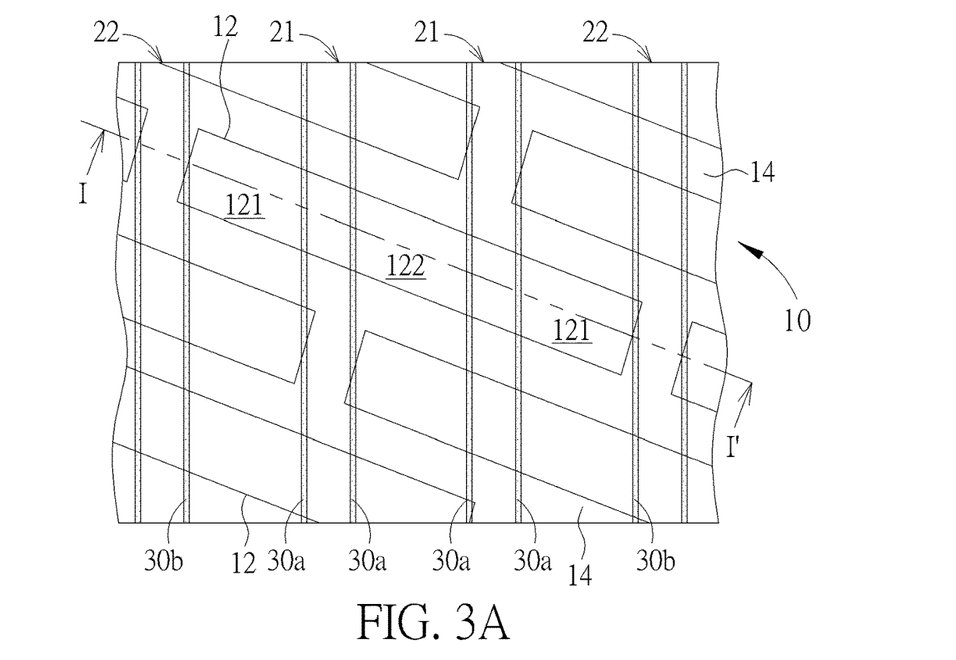
Figure 3B:
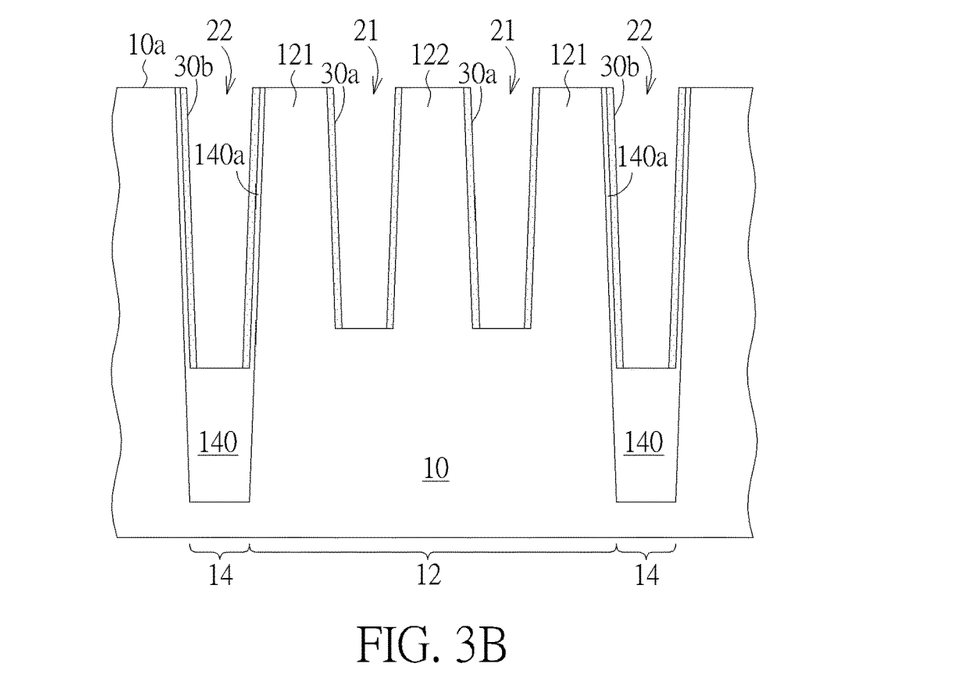

As shown in FIGS. 3A and 3B, the spacer material layer 30 is selectively etched to thereby form a first spacer 30a and a second spacer 30b in each first gate trench 21 and each second gate trench 22, respectively. The second spacer 30b in the second gate trench 22 may directly contact the insulating layer 140a left on the sidewall surface of the distal end portion 121. However, it is understood that in other embodiments, the insulating layer 140a may not be left on the sidewall surface of the distal end portion 121, and in that case, the second spacer 30b within the second gate trench 22 may directly contact the exposed silicon surface of the distal end portion 121.

Figure 4A:
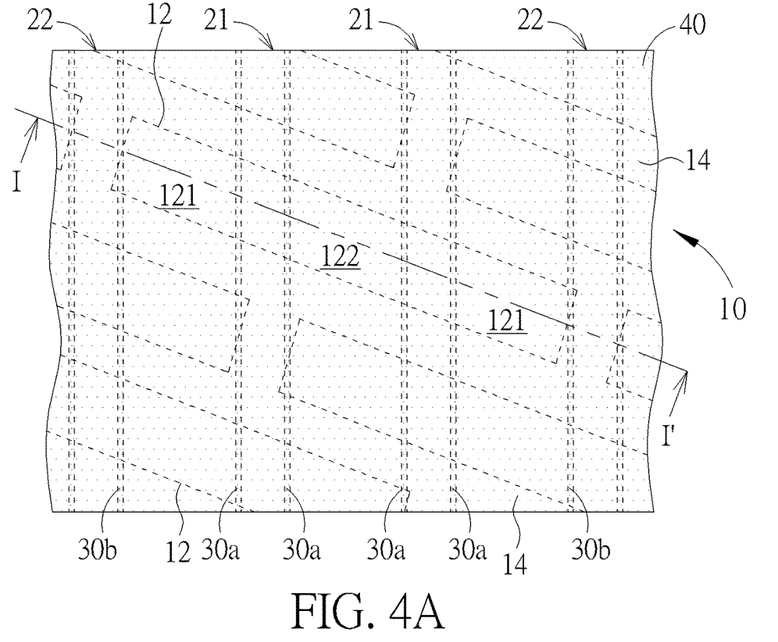
Figure 4B:
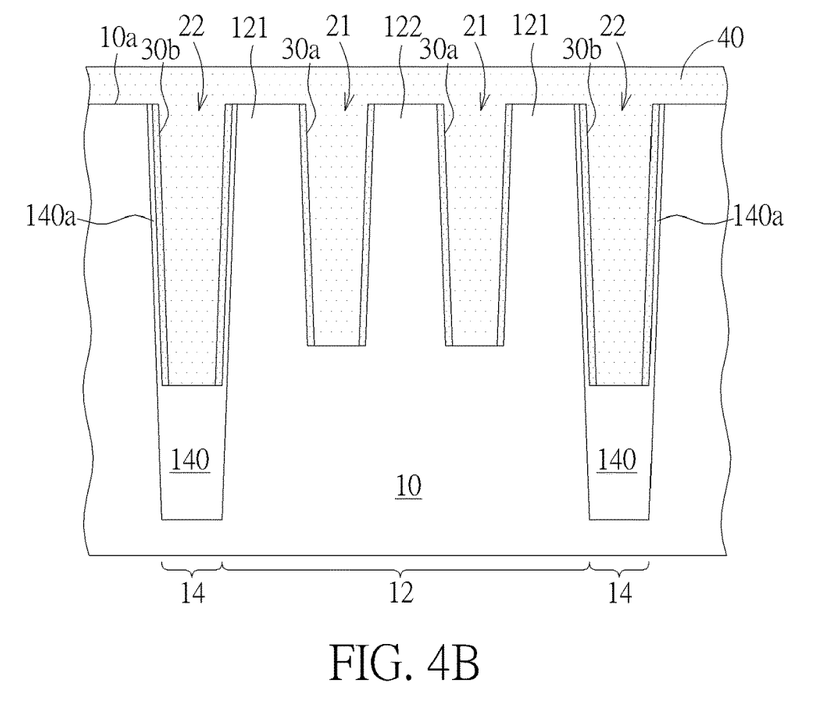

As shown in FIG. 4A and FIG. 4B, a planarization layer 40 is formed on the semiconductor substrate 10, in the first gate trench 21 and in the second gate trench 22. According to one embodiment of the present invention, for example, the planarization layer 40 may be a spin-on glass material or an anti-reflection layer material, but is not limited thereto. The planarization layer 40 fills up the first gate trenches 21 and the second gate trenches 22 so as to form a flat top surface.

Figure 5A:
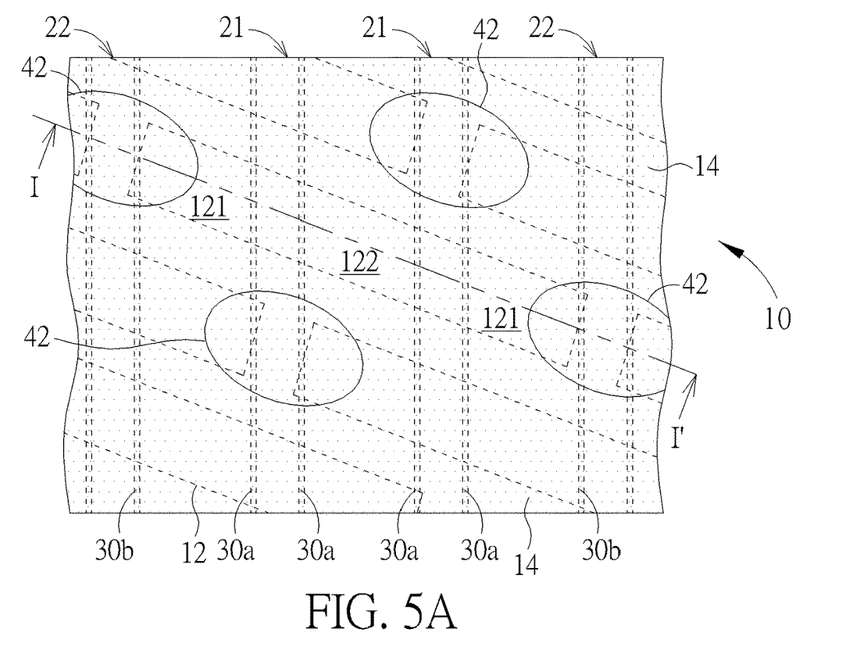
Figure 5B:
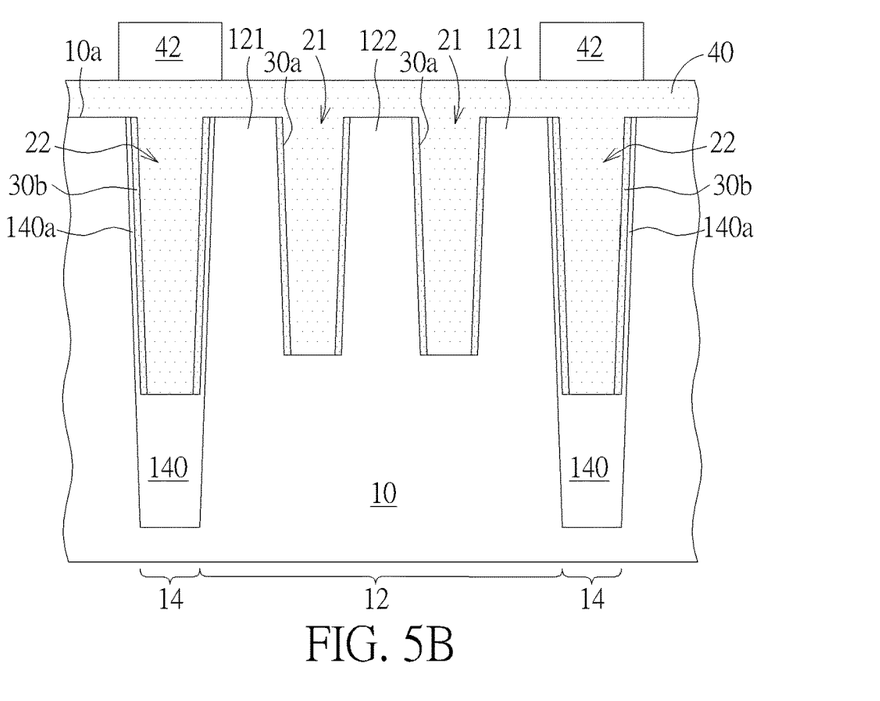

As shown in FIGS. 5A and 5B, a patterned photoresist layer 42 is formed on the planarization layer 40. The patterned photoresist layer 42 partially overlaps the distal end portions 121 of the active areas 12 and overlaps the trench isolation region 14 between two adjacent distal end portions 121.

It is noteworthy that the pattern or shape of the patterned photoresist layer 42 in FIG. 5A is for illustration purposes only. According to one embodiment of the present invention, the outline pattern or shape of the patterned photoresist layer 42 may be circular, quadrangular, egg or oval shapes, and the longer side or longer axis thereof may be parallel to the extending direction of the active areas 122, that is, the reference a-axis.

As can be seen from FIG. 5A, the patterned photoresist layer 42 comprises staggered patterns arranged or distributed in the localized regions. The staggered patterns distributed in localized regions cover only the two adjacent distal end portions 121 between two adjacent active areas aligned along the reference a-axis and the trench isolation region 14 between two adjacent distal end portions 121 of the two adjacent active areas aligned along the reference a-axis, respectively.

Figure 6A:
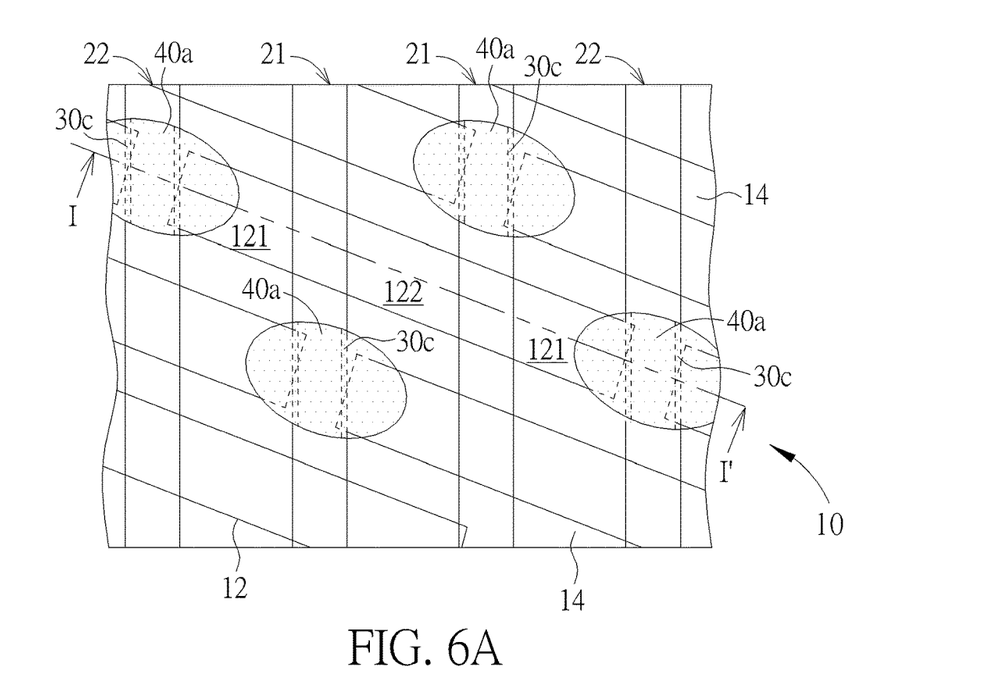
Figure 6B:
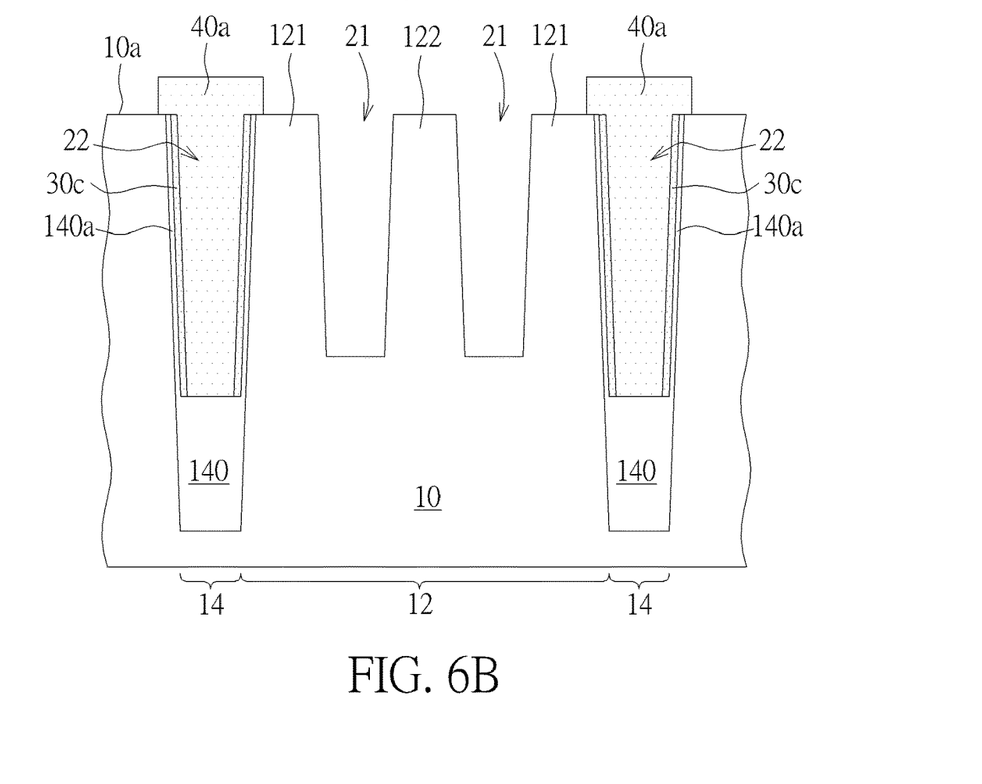

As shown in FIGS. 6A and 6B, an anisotropic dry etching process is performed. The planarization layer 40, the first spacers 30a, and the second spacers 30b, which are not covered by the photoresist layer 42 are removed, so as to form a localized planarization layer 40a and a sacrificial spacer 30c in each second gate trench 22. In this step, the first spacers 30a are completely removed from the region not covered by the photoresist layer 42 so as to expose the silicon sidewall surface of the active areas 12. In FIG. 6B, the sacrificial spacers 30c are formed only in localized regions in the second gate trenches 22.

Figure 7A:
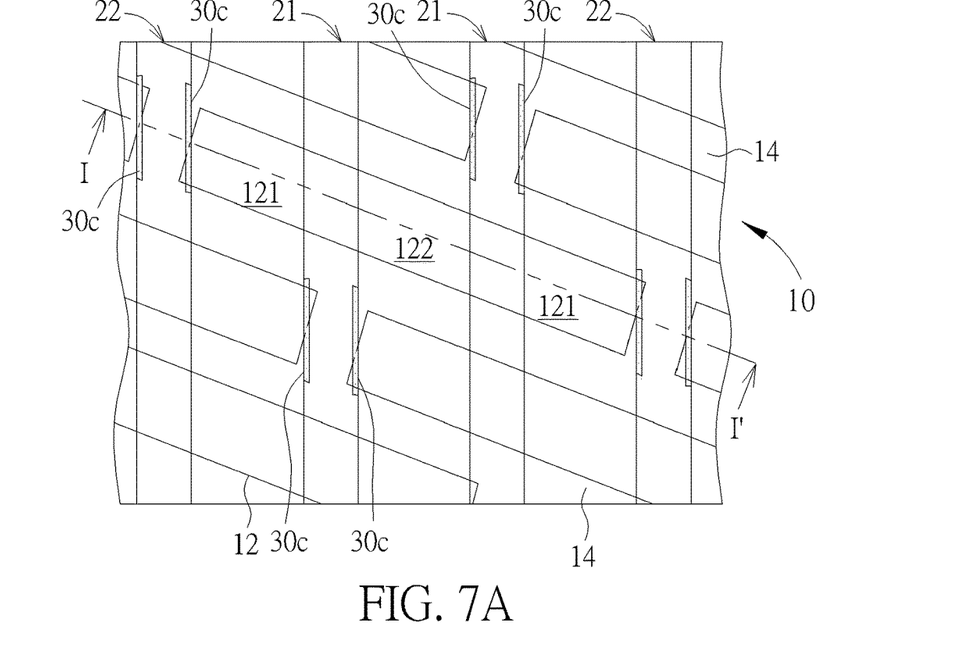
Figure 7B:
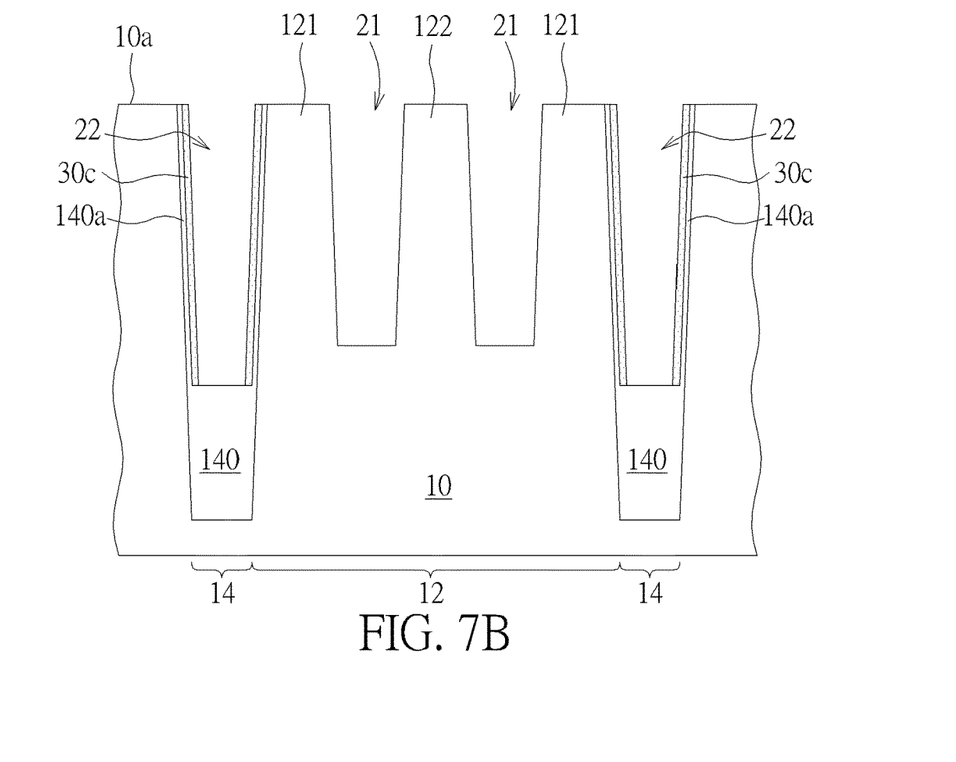

As shown in FIGS. 7A and 7B, the remaining photoresist layer 42 and the planarization layer 42a are removed. According to one embodiment of the present invention, the localized sacrificial spacers 30c are provided only on the sidewalls of the distal end portions 121 of the active areas 12.

Figure 8A:
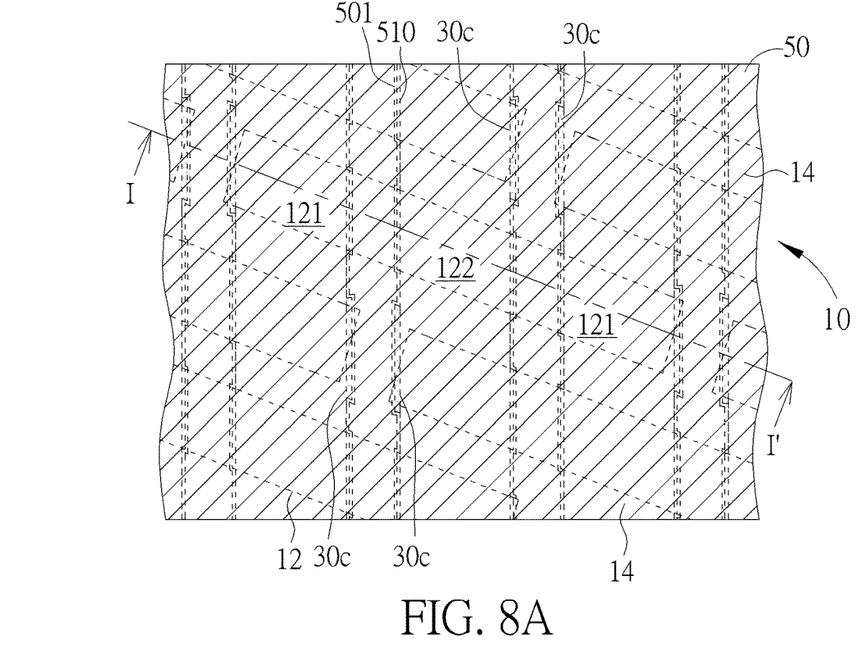
Figure 8B:
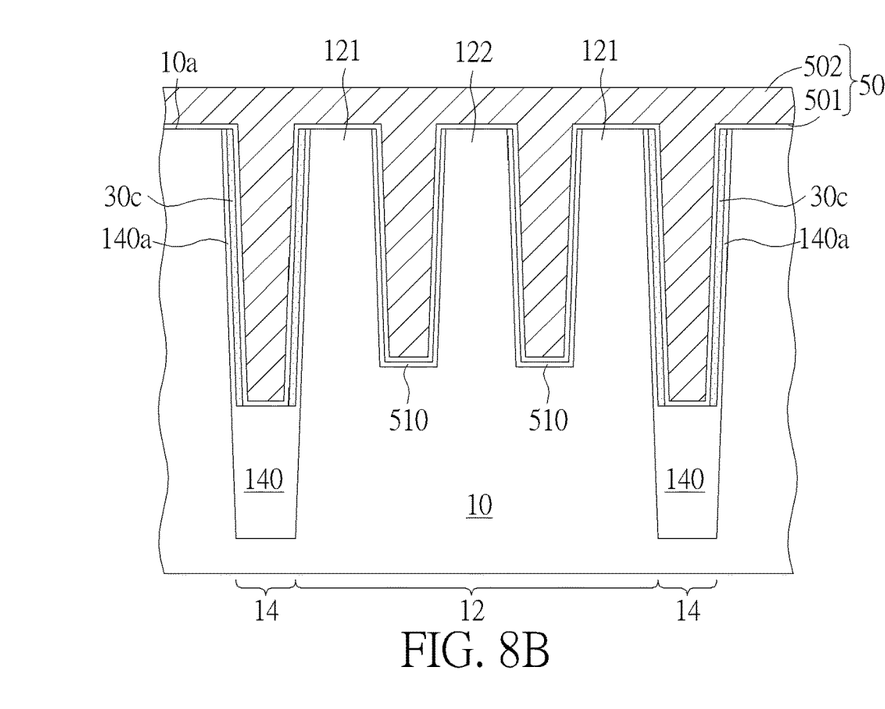

As shown in FIGS. 8A and 8B, after completion of the localized sacrificial spacers 30c, a gate material layer 50 is deposited in a blanket manner on the semiconductor substrate 10. The gate material layer 50 fills up the remaining space in the first gate trenches 21 and the second gate trenches 22.

According to one embodiment of the present invention, the gate material layer 50 may comprise a work function metal layer 501 and a low resistance metal layer 502. For example, the work function metal layer 501 may be a titanium nitride layer, and the low resistance metal layer 502 may be a tungsten metal layer. In the second gate trenches 22, as can be seen in FIG. 8B, gate material layer 50 may be in direct contact with the sacrificial spacer 30c.

Prior to the deposition of the gate material layer 50, a gate dielectric layer 510 may be formed on the surface of the semiconductor substrate 10. For example, the gate dielectric layer 510 may be a silicon dioxide layer formed by an in-situ steam generation (ISSG) method, but is not limited thereto.

Figure 9A:
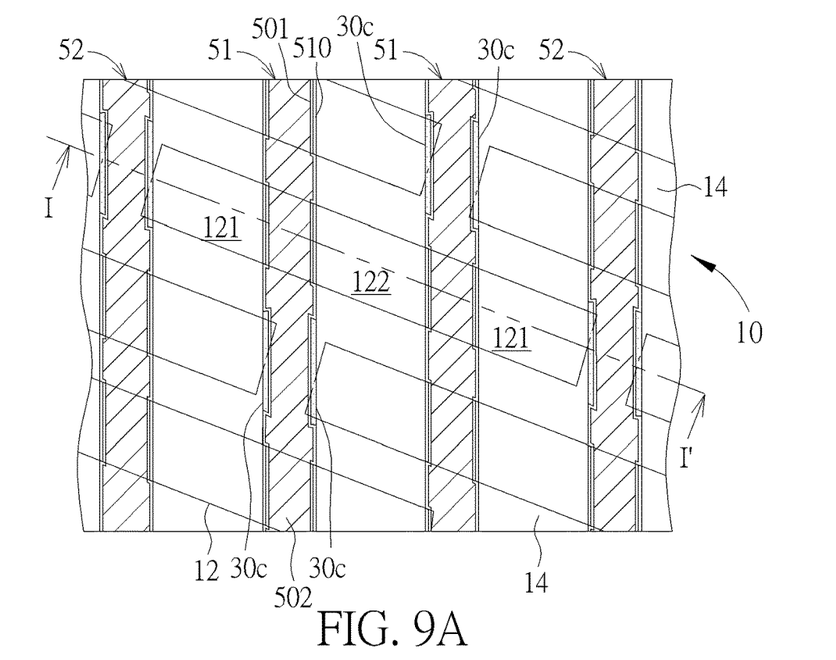
Figure 9B:
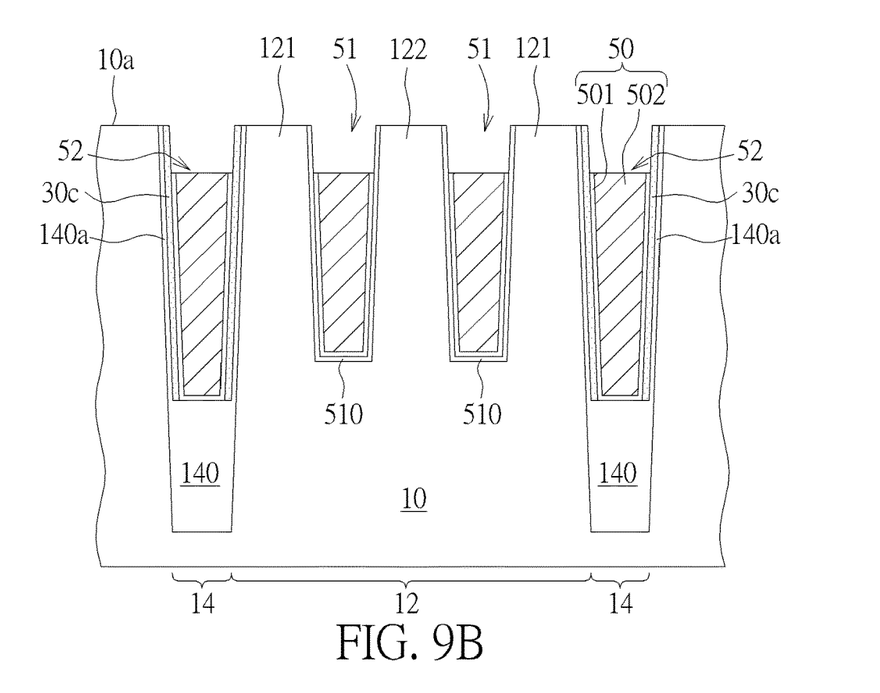

As shown in FIGS. 9A and 9B, the gate material layer 50 is etched back so that the top surface of the gate material layer 50 is lower than the major surface of the semiconductor substrate 10, so as to form a first gate electrode 51 and a second gate electrode 52 in the first gate trench 21 and the second gate trenches 22, respectively.

According to one embodiment of the present invention, in FIG. 9B, the first gate electrode 51 acts as a memory gate, and the second gate electrode 52 acts as a passing gate.

According to one embodiment of the present invention, at this point, the sacrificial spacer 30c still cover the sidewall surface of each distal end portion 121 of the active area 12 between the first gate electrode 51 and the second gate electrode 52, and the upper portion of the sacrificial spacer 30c is revealed.

Figure 10A:
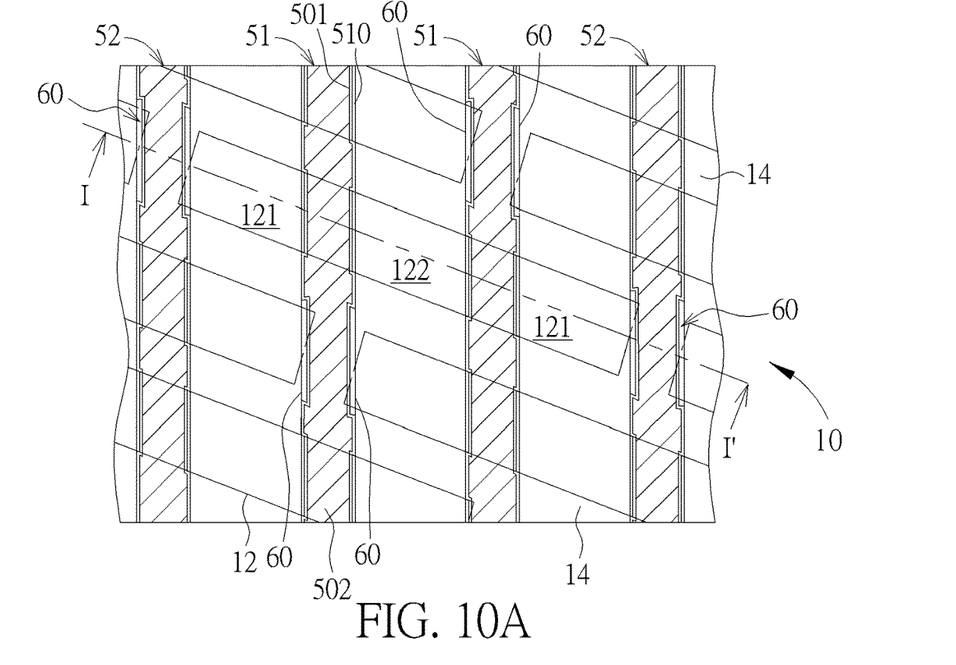
Figure 10B:
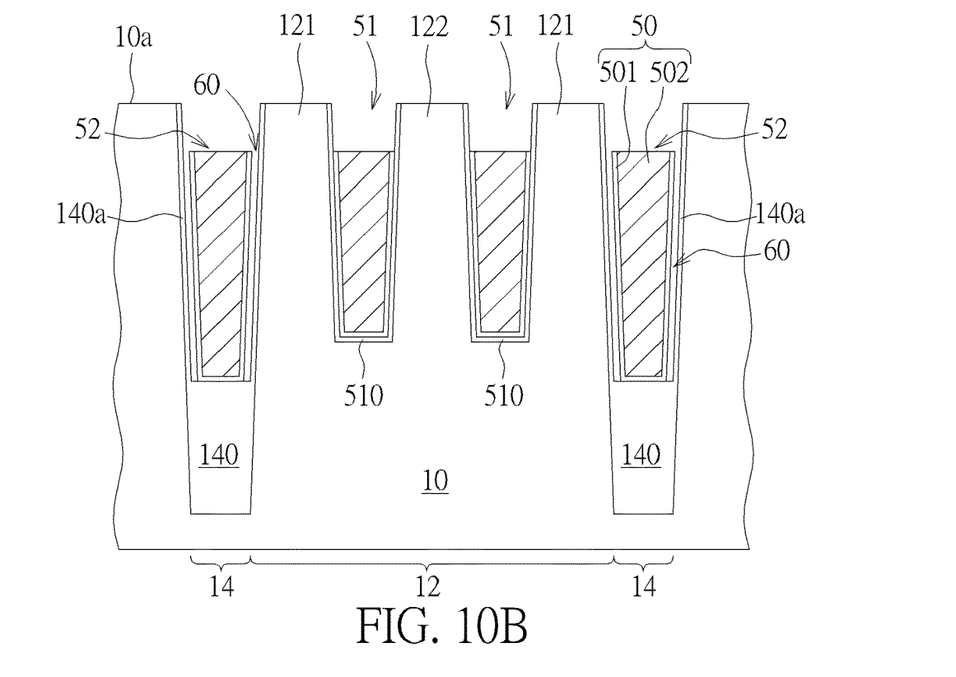

As shown in FIGS. 10A and 10B, subsequently, the sacrificial spacer 30c is selectively removed from the second gate trench 22 so that an air gap 60 is formed in each second gate trench 22 between the second gate electrode 52 and the semiconductor substrate 10. The width of the air gap 60 is approximately equal to the thickness of the sacrificial spacer 30c. For example, the width of the air gap 60 is about 2 to 5 nanometers.

According to one embodiment of the present invention, the sacrificial spacer 30c can be selectively etched with a solution containing phosphoric acid.

According to another embodiment of the present invention, the sacrificial spacer 30c may be selectively etched using a soft etch process. The soft etch process may include the use of a remote plasma containing nitrous oxide (NO) and fluorine (F) radicals.

Figure 11A:
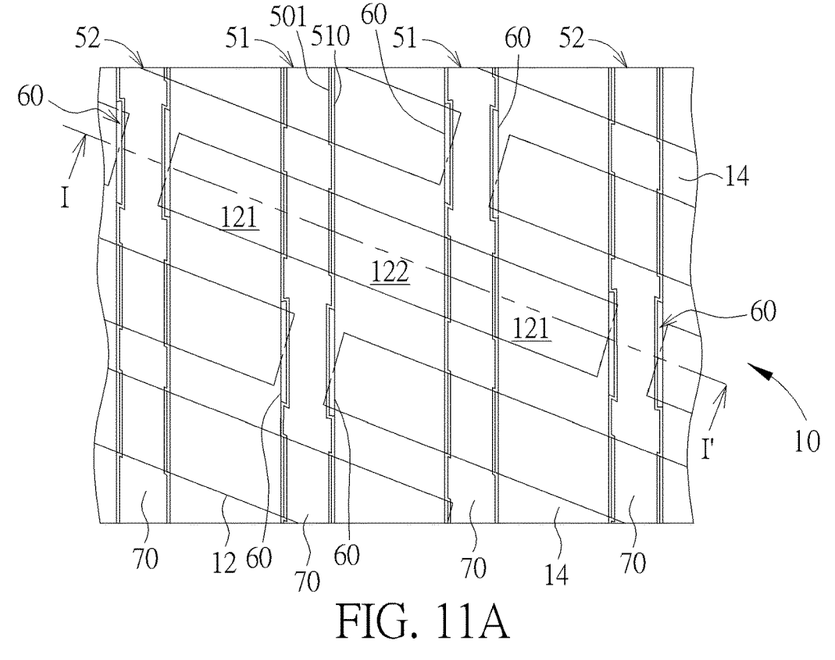
Figure 11B:
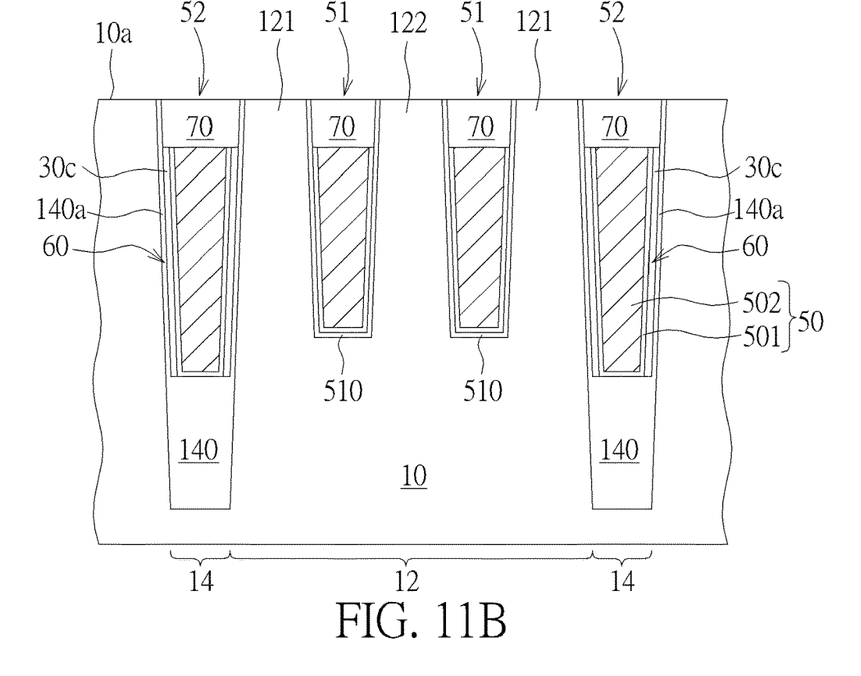

As shown in FIGS. 11A and 11B, a dielectric cap layer 70 is formed on the first gate electrode 51 and the second gate electrode 52. The dielectric cap layer 70 on the second gate electrode 52 seals the air gap 60.

For example, in the manner of forming the dielectric cap layer 70, a silicon nitride layer may be deposited by means of a plasma enhanced chemical vapor deposition (PECVD) method and the silicon nitride layer may be polished by a chemical mechanical polishing (CMP) process until the major surface 10a of the semiconductor substrate 10 is exposed.

According to another embodiment of the present invention, the dielectric cap layer 70 may be a silicon nitride layer and has a top surface 70a which is flush with the major surface 10a of the semiconductor substrate 10.

As can be seen from FIGS. 11A and 11B, a semiconductor structure 1 comprises a semiconductor substrate 10 having a trench isolation region 14 therein. The second gate electrode 52 is buried in the trench isolation region 14. The main technical feature of the present invention resides in an air gap 60 interposed between the second gate electrode 52 and the semiconductor substrate 10. The dielectric cap layer 70 is provided on the second gate electrode 52 and seals the air gap 60.

It is known that there is usually a silicon oxide layer between the second gate electrode 52 and the semiconductor substrate 10, and there may be charge accumulation and parasitic capacitance between the secondary gate electrode 52 (passing gate) and the active area 12 with the repetitive operation of the dynamic random access memory (DRAM). The dielectric constant of the silicon oxide layer is about 4.0, and the dielectric constant of gas or air as the medium in the air gap 60 is close to 1.0. By disposing the air gap 60 between the second gate electrode 52 and the semiconductor substrate 10, the parasitic capacitance between the second gate electrode 52 (passing gate) and the active area 12 can be effectively reduced, so that the row hammer phenomenon can be suppressed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
a semiconductor substrate having a major surface;
a trench isolation region in the semiconductor substrate;
an active area surrounded by the trench isolation region in the semiconductor substrate, wherein the active area has a longitudinal axis extending along a first direction;
a first gate electrode buried in the active area and adjacent to a distal end portion of the active area;
a second gate electrode buried in the trench isolation region and adjacent to the distal end portion of the active area; and
an air gap between the second gate electrode and the distal end portion of the active area, wherein the air gap overlaps with an entire thickness of the second gate electrode, wherein the first gate electrode is a memory gate electrode and the second gate electrode is a passing gate electrode, and wherein the air gap is adjacent to the second gate electrode and is not adjacent to the first gate electrode, and wherein the air gap overlaps with an entire thickness of the second gate electrode along a thickness direction that is perpendicular to a top surface of the semiconductor substrate, and wherein the air gap is discontinuous along an extending direction of the second gate electrode under a top view.

2. The semiconductor structure according to claim 1 further comprising a cap dielectric layer on the second gate electrode buried in the trench isolation region, wherein the cap dielectric layer seals the air gap.

3. The semiconductor structure according to claim 2, wherein the cap dielectric layer is a silicon nitride layer and has a top surface that is flush with the major surface of the semiconductor substrate.

4. The semiconductor structure according to claim 1 further comprising a silicon oxide layer disposed on a sidewall surface of the distal end portion.

5. The semiconductor structure according to claim 1, wherein a width of the air gap ranges between 2 nm and 5 nm.

6. The semiconductor structure according to claim 1 further comprising a first gate dielectric layer between the first gate electrode and the semiconductor substrate.

7. The semiconductor structure according to claim 1, wherein the second gate electrode extends along a second direction that is not perpendicular to the first direction.

8. The semiconductor structure according to claim 1, wherein the air gap is disposed only between the second gate electrode and the distal end portion of the active area as viewed under top view.

9. The semiconductor structure according to claim 1, wherein the air gap does not expose a tungsten layer of the second gate electrode.

* * * * *